(12) United States Patent
Hewett et al.

(10) Patent No.: US 9,946,309 B2
(45) Date of Patent: Apr. 17, 2018

(54) DEVICE WIRING

(71) Applicant: Microsoft Technology Licensing, LLC, Redmond, WA (US)

(72) Inventors: Anthony J. Hewett, Duvall, WA (US); Daniel C. Park, Woodinville, WA (US); Brian T. Whitman, University Place, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/179,383

(22) Filed: Jun. 10, 2016

(65) Prior Publication Data
US 2017/0357293 A1    Dec. 14, 2017

(51) Int. Cl.
*G06F 1/16*    (2006.01)
*H05K 5/02*    (2006.01)
*H05K 5/00*    (2006.01)

(52) U.S. Cl.
CPC ............ *G06F 1/1681* (2013.01); *G06F 1/166* (2013.01); *G06F 1/1616* (2013.01); *G06F 1/1683* (2013.01); *H05K 5/0017* (2013.01); *H05K 5/0226* (2013.01); *H05K 5/0234* (2013.01); *H05K 5/0247* (2013.01)

(58) Field of Classification Search
CPC ...... G06F 1/1616; G06F 1/166; G06F 1/1681; G06F 1/1683
USPC ............... 361/679.01–679.3, 679.55–679.59; 248/917–924
See application file for complete search history.

(56) References Cited

U.S. PATENT DOCUMENTS

| 4,006,839 | A |   | 2/1977 | Thiel et al. |
| 4,438,458 | A | * | 3/1984 | Munscher ............ G06F 1/1601 248/184.1 |
| 4,802,605 | A |   | 2/1989 | Salmon et al. |
| 4,825,395 | A |   | 4/1989 | Kinser et al. |
| 4,834,329 | A | * | 5/1989 | Delapp .................. F16M 11/10 248/183.3 |
| 5,200,913 | A |   | 4/1993 | Hawkins et al. |

(Continued)

FOREIGN PATENT DOCUMENTS

| CN | 201651697 U | 11/2010 |
| EP | 1344972 A2 | 9/2003 |

(Continued)

OTHER PUBLICATIONS

"Are there any types of DC motors that self-lock themselves?", retrieved at <<http://electronics.stackexchange.com/questions/91916/are-there-any-types-of-dc-motors-that-self-lock-themselves>>, Nov. 26, 2013, 2 pages.

(Continued)

*Primary Examiner* — Nidhi Thaker
(74) *Attorney, Agent, or Firm* — Rainier Patents, P.S.

(57) ABSTRACT

The description relates to devices that can include a base assembly, upper assembly, an arm, and a conductor. In one example the base assembly can include a base shaft and the upper assembly can include an upper shaft. The arm can be secured to the base shaft and the upper shaft to translate a range of rotation of the arm around the base shaft to rotation around the display shaft. The conductor can extend from the base assembly into the arm parallel to the base shaft and extend from the arm into the upper assembly parallel to the upper shaft.

19 Claims, 15 Drawing Sheets

(56) References Cited

U.S. PATENT DOCUMENTS

| | | | |
|---|---|---|---|
| 5,235,495 A | 8/1993 | Blair et al. | |
| 5,239,730 A | 8/1993 | Grass | |
| 5,278,725 A | 1/1994 | Konno et al. | |
| 5,394,297 A | 2/1995 | Toedter | |
| 5,498,165 A | 3/1996 | Tseng | |
| 5,729,429 A | 3/1998 | Margaritis et al. | |
| 5,876,008 A | 3/1999 | Sweere et al. | |
| 5,954,642 A | 9/1999 | Johnson et al. | |
| 6,079,993 A | 6/2000 | Laine | |
| 6,223,393 B1 | 5/2001 | Knopf | |
| 6,262,885 B1 | 7/2001 | Emma et al. | |
| 6,381,125 B1 | 4/2002 | Mizoguchi et al. | |
| 6,503,167 B1 | 1/2003 | Sturm | |
| 6,530,123 B1 | 3/2003 | Wahlstedt | |
| 6,730,867 B2 | 5/2004 | Hyp | |
| 6,766,180 B2 | 7/2004 | Doraiswamy et al. | |
| 6,816,364 B2* | 11/2004 | Helot | F16M 11/105 |
| | | | 248/919 |
| 6,822,857 B2 | 11/2004 | Jung et al. | |
| 6,871,384 B2 | 3/2005 | Novin et al. | |
| 7,043,797 B2 | 5/2006 | Cau | |
| 7,054,147 B2 | 5/2006 | Maatta et al. | |
| 7,145,768 B2 | 12/2006 | Hillman et al. | |
| 7,289,315 B2* | 10/2007 | Hillman | F16M 11/10 |
| | | | 248/280.11 |
| 7,301,759 B2 | 11/2007 | Hsiung | |
| 7,461,433 B2 | 12/2008 | Pan et al. | |
| 7,478,786 B2 | 1/2009 | Copeland | |
| 7,506,853 B2 | 3/2009 | Sweere et al. | |
| 7,643,275 B2 | 1/2010 | Williams et al. | |
| 7,654,755 B2 | 2/2010 | Orf et al. | |
| 7,694,919 B2 | 4/2010 | Lee | |
| 7,766,288 B2 | 8/2010 | Kim et al. | |
| 7,886,903 B1 | 2/2011 | Wurzelbacher, Jr. et al. | |
| 8,011,623 B2* | 9/2011 | Hwang | F16M 11/105 |
| | | | 248/166 |
| 8,035,957 B2* | 10/2011 | Jung | F16M 11/105 |
| | | | 248/917 |
| 8,075,128 B2 | 12/2011 | Park et al. | |
| 8,104,142 B2 | 1/2012 | Lowry et al. | |
| 8,230,553 B2 | 7/2012 | Degner et al. | |
| 8,230,992 B2 | 7/2012 | Law et al. | |
| 8,259,437 B2 | 9/2012 | Vesely | |
| 8,310,468 B2 | 11/2012 | Martin | |
| 8,400,767 B2 | 3/2013 | Yeom et al. | |
| 8,505,169 B2 | 8/2013 | Wood et al. | |
| 8,534,635 B2 | 9/2013 | Yang et al. | |
| 8,537,533 B2 | 9/2013 | Sung | |
| 8,549,710 B2 | 10/2013 | Novin | |
| 8,672,277 B2 | 3/2014 | Hsu | |
| 8,724,306 B2 | 5/2014 | Ashcraft et al. | |
| 8,769,772 B2 | 7/2014 | Griffin et al. | |
| 8,787,016 B2 | 7/2014 | Rothkopf et al. | |
| 8,811,005 B2 | 8/2014 | Casebolt et al. | |
| 8,897,033 B2 | 11/2014 | Slipy et al. | |
| 8,922,995 B2 | 12/2014 | Su | |
| 8,925,153 B1 | 1/2015 | McGrath | |
| 9,004,436 B2 | 4/2015 | Chen | |
| 9,010,822 B2 | 4/2015 | Rasmussen et al. | |
| 9,013,865 B2 | 4/2015 | Chen et al. | |
| 9,064,431 B2 | 6/2015 | Ahn et al. | |
| 9,072,179 B2 | 6/2015 | Su | |
| 9,095,253 B2 | 8/2015 | Hinman et al. | |
| 9,104,372 B2 | 8/2015 | Frenzel | |
| 9,155,235 B2 | 10/2015 | Lindblad et al. | |
| 9,291,299 B2 | 3/2016 | Richard et al. | |
| 9,448,583 B1 | 9/2016 | Lee et al. | |
| 2003/0223188 A1 | 12/2003 | Ha et al. | |
| 2004/0021051 A1 | 2/2004 | Chiu | |
| 2004/0066614 A1 | 4/2004 | Hong | |
| 2004/0127266 A1 | 7/2004 | Aagaard et al. | |
| 2004/0216273 A1 | 11/2004 | Kang et al. | |
| 2005/0088808 A1 | 4/2005 | Michoux et al. | |
| 2005/0108854 A1 | 5/2005 | Lee et al. | |
| 2005/0128695 A1 | 6/2005 | Han | |
| 2005/0247832 A1 | 11/2005 | Cho et al. | |
| 2005/0254203 A1* | 11/2005 | Choi | F16M 11/105 |
| | | | 361/679.27 |
| 2006/0039104 A1 | 2/2006 | Wang et al. | |
| 2006/0133016 A1 | 6/2006 | North et al. | |
| 2006/0176655 A1* | 8/2006 | Hillman | F16M 11/10 |
| | | | 361/679.06 |
| 2007/0028419 A1 | 2/2007 | Lu et al. | |
| 2007/0047186 A1* | 3/2007 | Jang | F16M 11/10 |
| | | | 361/679.06 |
| 2007/0058329 A1 | 3/2007 | Ledbetter et al. | |
| 2007/0086155 A1* | 4/2007 | Chen | G06F 1/1616 |
| | | | 361/679.06 |
| 2007/0151079 A1 | 7/2007 | Lu et al. | |
| 2007/0152125 A1 | 7/2007 | Lee | |
| 2007/0230095 A1 | 10/2007 | Wu | |
| 2008/0068494 A1 | 3/2008 | Kim | |
| 2008/0094792 A1 | 4/2008 | Chen et al. | |
| 2008/0122736 A1 | 5/2008 | Ronzani et al. | |
| 2009/0166501 A1 | 7/2009 | Wang et al. | |
| 2010/0059648 A1 | 3/2010 | Zhang et al. | |
| 2010/0084522 A1 | 4/2010 | Zhou et al. | |
| 2010/0124009 A1 | 5/2010 | Jiang et al. | |
| 2011/0051437 A1 | 3/2011 | Ng et al. | |
| 2011/0062304 A1 | 3/2011 | Hsieh et al. | |
| 2011/0127392 A1 | 6/2011 | Carter | |
| 2011/0286171 A1 | 11/2011 | Franz et al. | |
| 2011/0299233 A1 | 12/2011 | Kim | |
| 2012/0036679 A1 | 2/2012 | Chen | |
| 2012/0091298 A1 | 4/2012 | Huang | |
| 2012/0262857 A1 | 4/2012 | Fukaya et al. | |
| 2012/0102675 A1 | 5/2012 | Lee et al. | |
| 2012/0328222 A1 | 12/2012 | Chen et al. | |
| 2013/0010424 A1 | 1/2013 | Degner et al. | |
| 2013/0021723 A1 | 1/2013 | Harper et al. | |
| 2013/0044454 A1 | 2/2013 | Lin et al. | |
| 2013/0112818 A1 | 5/2013 | Hsu | |
| 2013/0144446 A1 | 6/2013 | Rihn et al. | |
| 2014/0063750 A1 | 3/2014 | Mau et al. | |
| 2014/0085798 A1 | 3/2014 | Myerchin | |
| 2014/0159995 A1 | 6/2014 | Adams et al. | |
| 2014/0215758 A1 | 8/2014 | Franklin et al. | |
| 2014/0218854 A1 | 8/2014 | Onda | |
| 2014/0268555 A1 | 9/2014 | Kurczewski | |
| 2014/0298616 A1 | 10/2014 | Baer | |
| 2014/0321041 A1 | 10/2014 | Hsu et al. | |
| 2014/0353453 A1 | 12/2014 | Quijano et al. | |
| 2015/0000435 A1 | 1/2015 | Zhang et al. | |
| 2015/0048230 A1 | 2/2015 | Satterfield | |
| 2015/0092335 A1 | 4/2015 | Patrick et al. | |
| 2015/0097092 A1 | 4/2015 | Fu et al. | |
| 2015/0121654 A1 | 5/2015 | Novin | |
| 2015/0185709 A1 | 7/2015 | Vroom et al. | |
| 2015/0265048 A1 | 9/2015 | Lindblad | |
| 2015/0277506 A1 | 10/2015 | Cheah et al. | |
| 2015/0285233 A1 | 10/2015 | Theodore | |
| 2015/0336480 A1 | 11/2015 | Szakelyhidi et al. | |
| 2015/0362962 A1 | 12/2015 | Lee et al. | |
| 2016/0161045 A1 | 6/2016 | Lee et al. | |
| 2017/0300082 A1 | 10/2017 | Park et al. | |
| 2017/0300083 A1 | 10/2017 | Park et al. | |
| 2017/0303413 A1 | 10/2017 | Park et al. | |
| 2017/0303415 A1 | 10/2017 | Deily et al. | |
| 2017/0311464 A1 | 10/2017 | Park et al. | |

FOREIGN PATENT DOCUMENTS

| | | |
|---|---|---|
| EP | 1507387 A1 | 2/2005 |
| EP | 1526436 A2 | 4/2005 |
| TW | M430129 U | 5/2012 |
| WO | 98/16144 A1 | 4/1998 |
| WO | 2006095987 A1 | 9/2006 |
| WO | WO 2015/016837 A1 | 2/2015 |

OTHER PUBLICATIONS

"Grass Products", retrieved at <<http://www.grass.at/uebersicht-nexis-click-on.html?L=1>>, on Dec. 24, 2015, 1 page.

(56) References Cited

OTHER PUBLICATIONS

"Prepara iPrep Tablet Stand with Stylus", retrieved at <<http://www.rakuten.com/prod/prepara-iprep-tablet-stand-with-stylus-white/256971780.html>>, on Dec. 29, 2015, 3 pages.
"World's First "Ultra-Compact One-Way Clutch" Announced", retrieved at <<http://www.ntn.co.jp/english/news/new_products/news20020315.html#add1>>, Mar. 15, 2002, 2 pages.
Korane, Kenneth, "Options for Designing the Best Hinge", retrieved at <<http://machinedesign.com/news/options-designing-best-hinge>>, Jul. 19, 2012, 4 pages.
Lenovo Yoga 3 Pro, captured by the Internet archive on Aug. 11, 2015 at <<http://shop.lenovo.com/us/en/laptops/lenovo/yoga-laptop-series/yoga-3-pro-laptop/>>, 2 pages.
Subramanian, et al., "Assembly Analysis of Interference Fits in Elastic Materials", Proceedings of 5th IFIP WG 5.5 International Precision Assembly Seminar, IFIP Advances in Information and Communication Technology, Feb. 14, 2010, 9 pages.
Westover, Brian, "HP Spectre x360 13t (13-4003)", captured by the Internet archive on Jul. 21, 2015 at <<http://in.pcmag.com/hp-spectre-x360-13t-13-4003/40964/review/hp-spectre-x360-13l-13-4003>>, 6 pages.
U.S. Appl. No. 62/357,880 titled "Hinge Clutch" filed Jul. 1, 2016 by Inventor Mario E. Castillo, 47 pages.
"Humanscale M8 Monitor Arm", Published on: Apr. 12, 2012 Available at: http://www.thehumansolution.com/humanscale-m8-monitor-arm-sds.html.
Restriction Requirement dated Jun. 8, 2017 from U.S. Appl. No. 15/139,197, 5 pages.
Notice of Allowance dated Apr. 20, 2017 from U.S. Appl. No. 15/099,238, 38 pages.
International Search Report and Written Opinion dated Jul. 7, 2017 from PCT Patent Application No. PCT/US2017/027080, 25 pages.
International Search Report and Written Opinion dated Jul. 18, 2017 from PCT Patent Application No. PCT/US2017/027081, 27 pages.
International Search Report and Written Opinion dated Jun. 8, 2017 from PCT Patent Application No. PCT/US2017/026872, 20 pages.
International Search Report and Written Opinion dated Jul. 18, 2017 from PCT Patent Application No. PCT/US2017/028240, 13 pages.
International Search Report and Written Opinion dated Jun. 30, 2017 from PCT Patent Application No. PCT/US2017/027082, 24 pages.
International Search Report and Written Opinion dated Jun. 30, 2017 from PCT Patent Application No. PCT/US2017/026874, 22 pages.
Non-Final Office Action dated Jul. 13, 2017 from U.S. Appl. No. 15/099,441, 46 pages.
Response filed Oct. 9, 2017 to Non-Final Office Action dated Jul. 13, 2017 from U.S. Appl. No. 15/099,441, 9 pages.
Corrected Notice of Allowability dated Jun. 20, 2017 from U.S. Appl. No. 15/099,238, 8 pages.
Corrected Notice of Allowability dated Jul. 13, 2017 from U.S. Appl. No. 15/099,238, 8 pages.
Notice of Allowance dated Sep. 19, 2017 from U.S. Appl. No. 15/099,238, 20 pages.
Response filed Oct. 9, 2017 to the Restriction Requirement dated Jun. 8, 2017 from U.S. Appl. No. 15/139,197, 6 pages.
Invitation to Pay Additional Fees and partial International Search Report dated Sep. 1, 2017 from PCT Patent Application No. PCT/US2017/035571, 13 pages.
Non-Final Office Action dated Nov. 14, 2017 from U.S. Appl. No. 15/139,197, 56 pages.
Non-Final Office Action dated Nov. 17, 2017 from U.S. Appl. No. 15/099,501, 60 pages.
"International Search Report and Written Opinion Issued in PCT Application No. PCT/US2017/035571", dated Dec. 6, 2017, 19 pages.

* cited by examiner

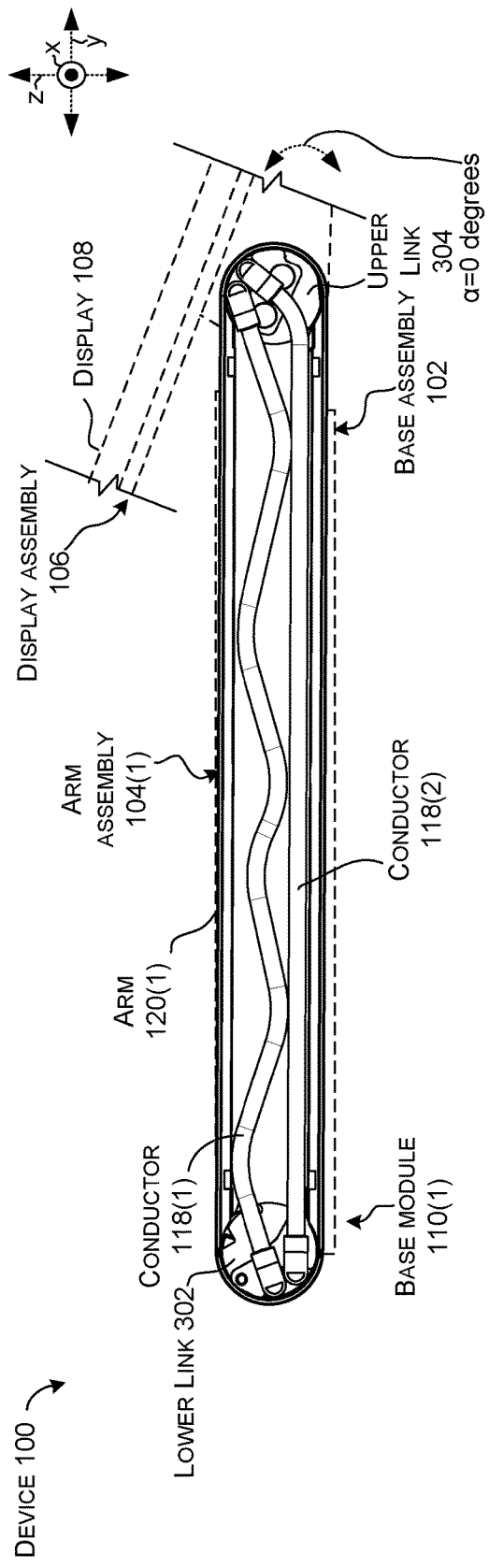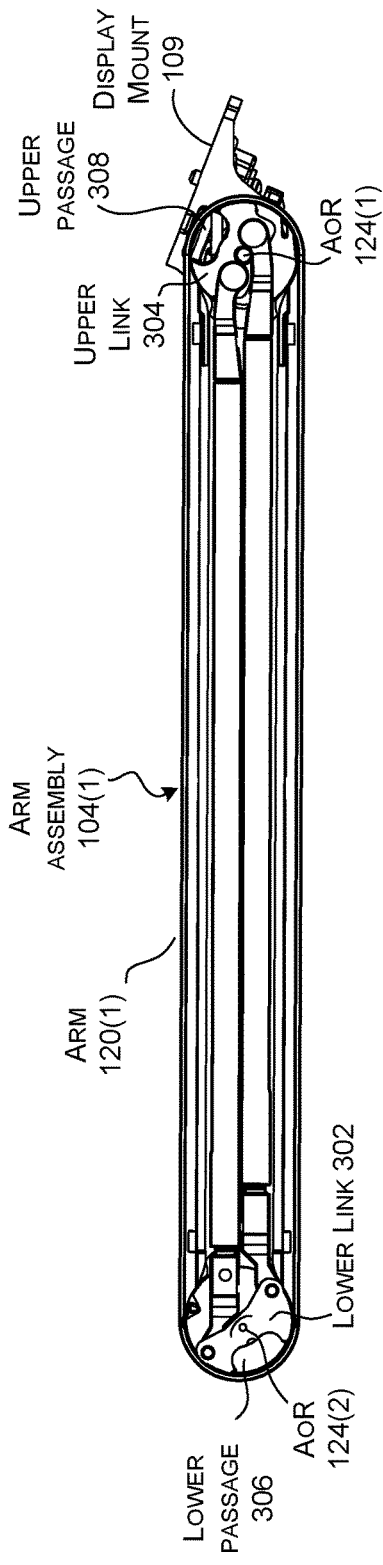
FIG. 3E
FIG. 3F

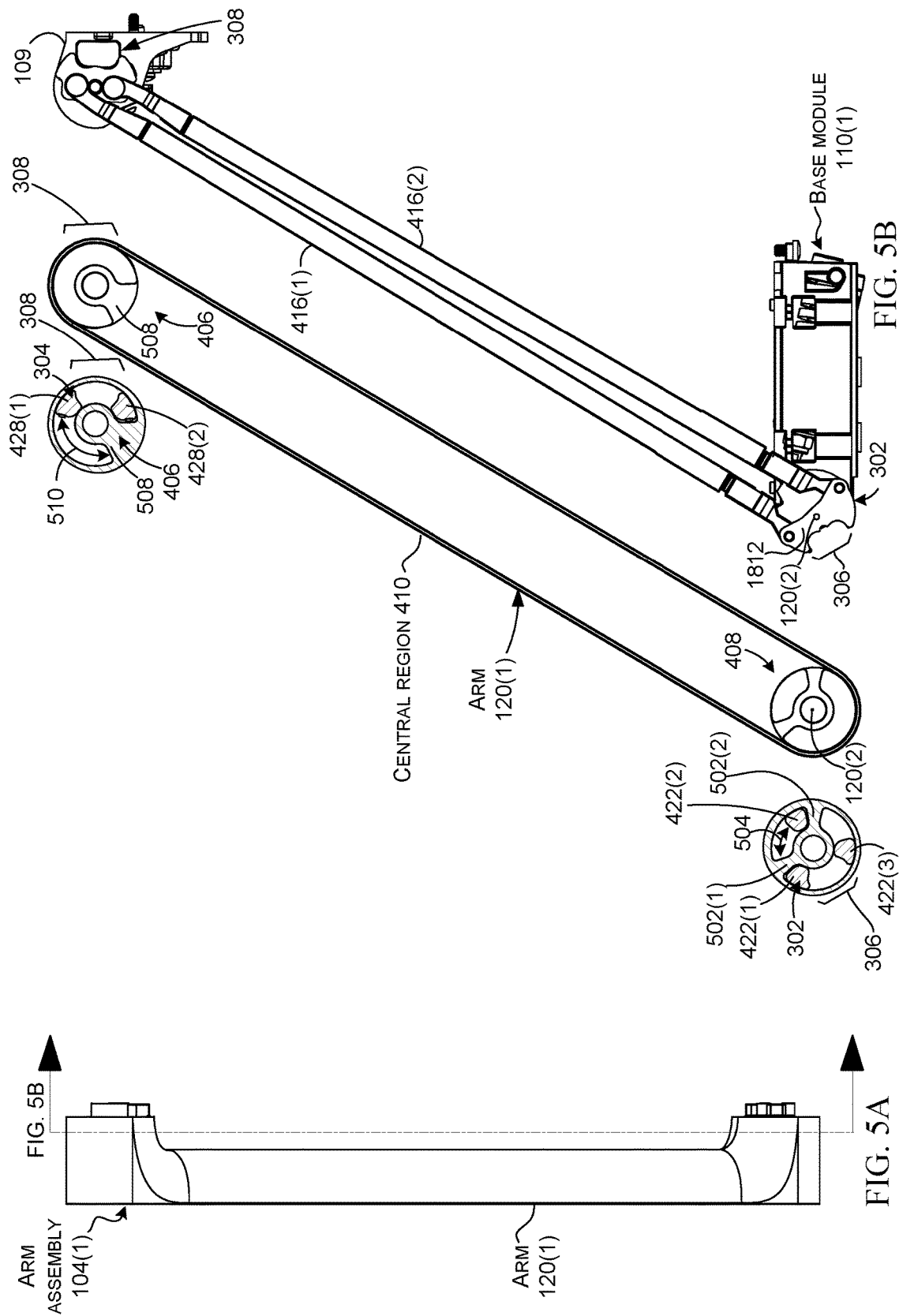

9,946,309 B2

DEVICE WIRING

BACKGROUND

The description relates to devices and specifically to hinged devices and conductors of hinged devices.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 1C, 1D, 2, and 3A-3F are elevational views of an example device in accordance with the present concepts.

FIGS. 5A and 5B are elevational views of portions of example devices in accordance with the present concepts.

DESCRIPTION

Figure 1A:
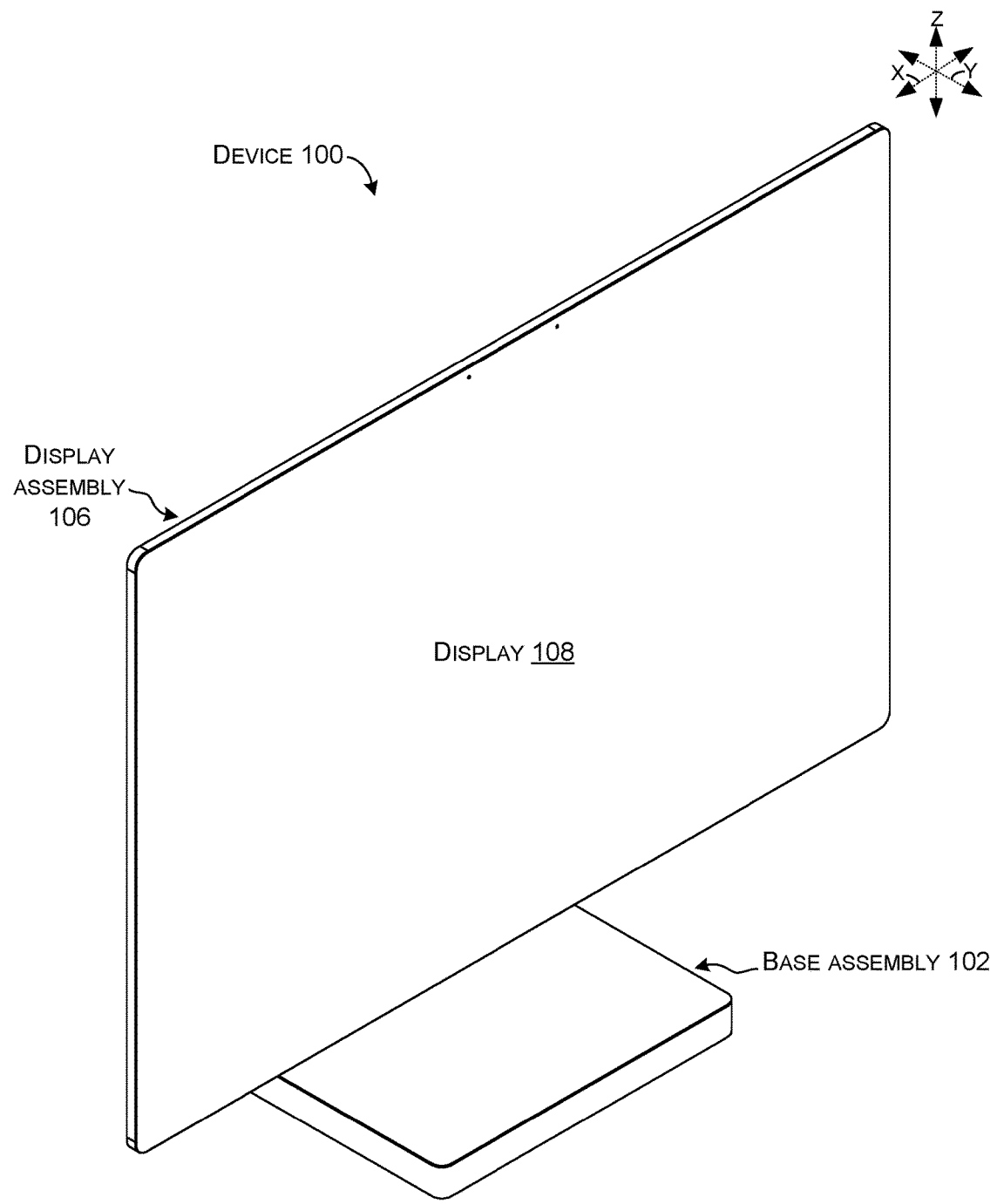
FIGS. 1A and 1B are perspective views of an example device in accordance with the present concepts.
Figure 1B:
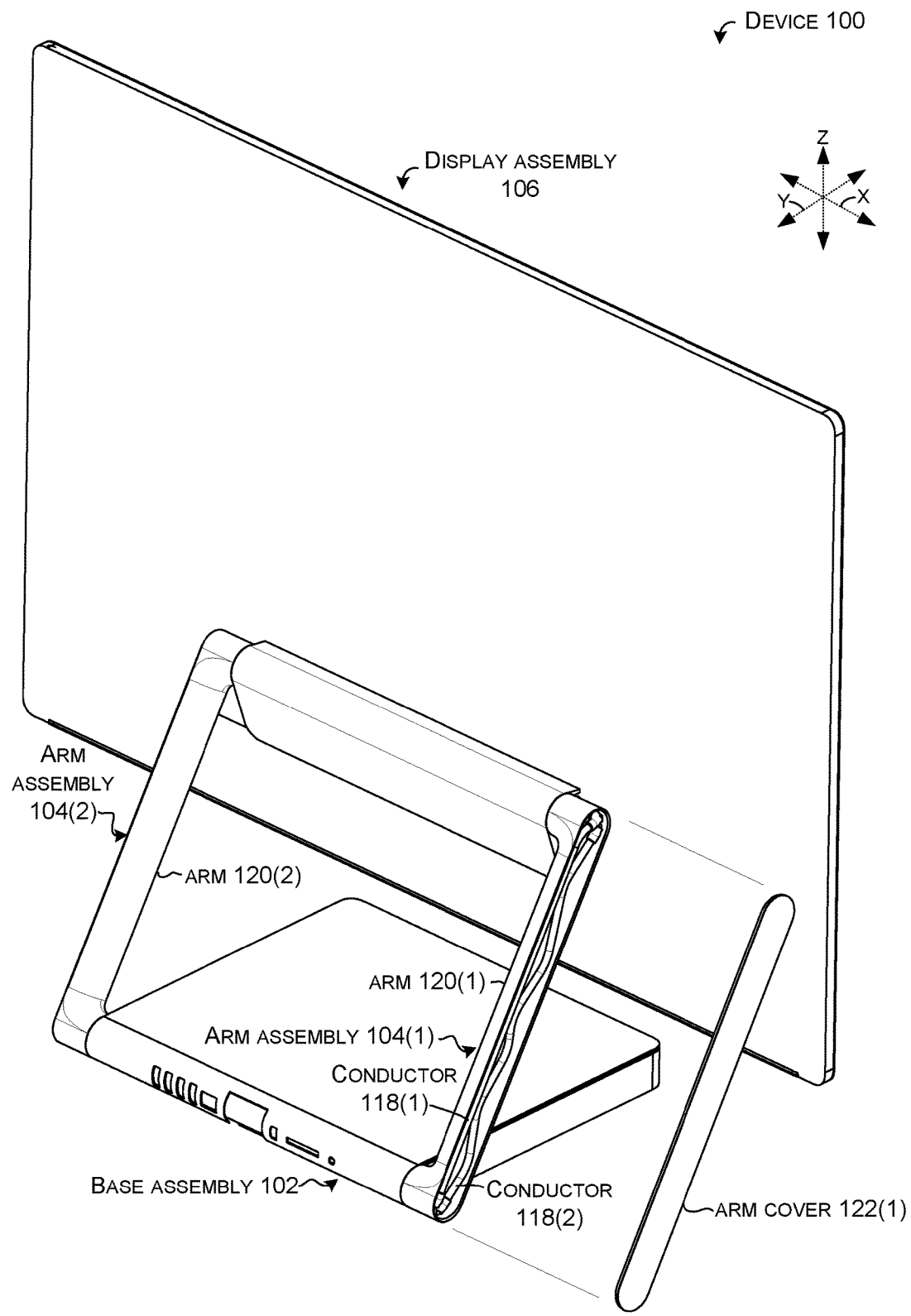
Figure 1C:
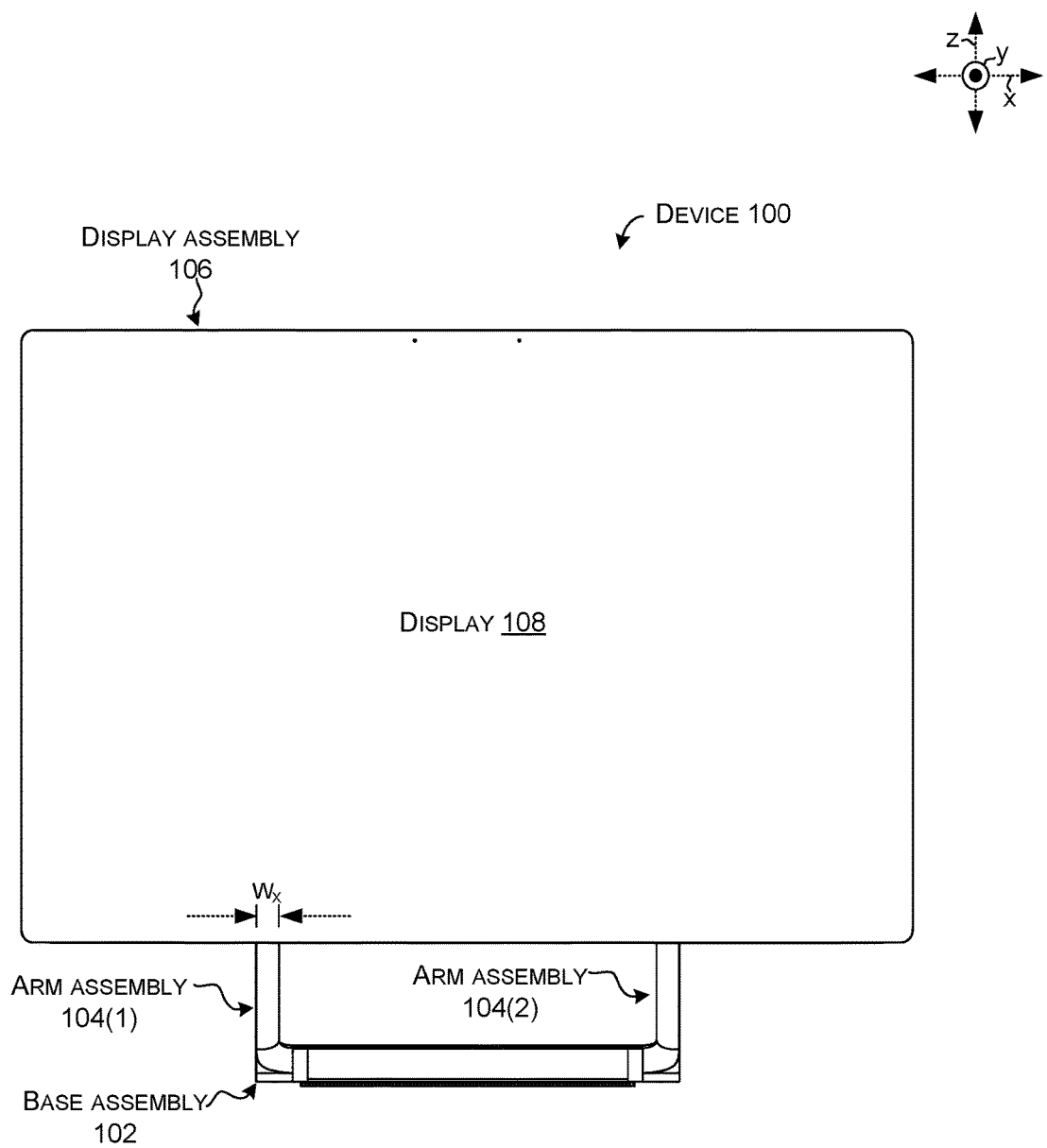

The present concepts relate to devices, such as computing devices that can include an adjustable display. The device can include a base assembly that can define a lower axis of rotation and a display assembly that can define an upper axis of rotation associated with the display. An arm assembly can be connected to the lower axis of rotation and the upper axis of rotation to control a position and orientation of the display. One or more conductors, such as a wiring harness, can run through the arm to electrically connect electronic components in the base assembly to the display. The conductors can enter the arm parallel to the axes of rotation and be maintained in fixed relation to the base assembly and the display assembly while the arm rotates relative to the lower and/or upper axes of rotation.

Introductory FIGS. 1A-1D collectively show an example device 100 that includes a base assembly 102, an arm assembly 104, and an upper assembly that in this example is manifest as a display assembly 106. The display assembly can include a display 108 secured to a display mount 109. The base assembly 102 can include a base module 110 and a housing 112 that can contain various electronic components 114, such as a processor 116 for controlling the display 108, a battery, and/or an AC-to-DC converter, among others. The controlling can be achieved via conductors 118 that travel from the base assembly 102 to the display assembly 106 via the arm assembly 104. Note that there can be two arm assemblies 104(1) and 104(2) and two base modules 110(1) and 110(2) (e.g., right and left), but these elements can generally be discussed interchangeably or generically in the description below. As a result, the suffix (e.g., "(1)" or "(2)") may not be used strictly in the following description and drawings.

The arm assembly 104 can include a hinge arm (e.g., 'arm') 120 and an arm cover 122. The arm assembly 104 can rotatably couple the display assembly 106 to the base assembly 102 and can be secured to the upper and lower axes of rotation 124(1) and 124(2) to rotate with the upper axis of rotation and the lower axis of rotation. Specifically, rotation around the lower axis of rotation 124(2) can define an angle alpha or 'α' between the hinge arm 120 and the base assembly 102 (e.g., between the hinge arm and a horizontal surface 126 upon which the device is positioned). This can be thought of as the 'position' of the display. Rotation around hinge axes 124(1) and 124(2) can define an angle beta or 'β' between the display assembly 106 (e.g., display 108) and the horizontal surface 126. This beta angle can be thought of as the orientation or angle of the display.

Figure 2:
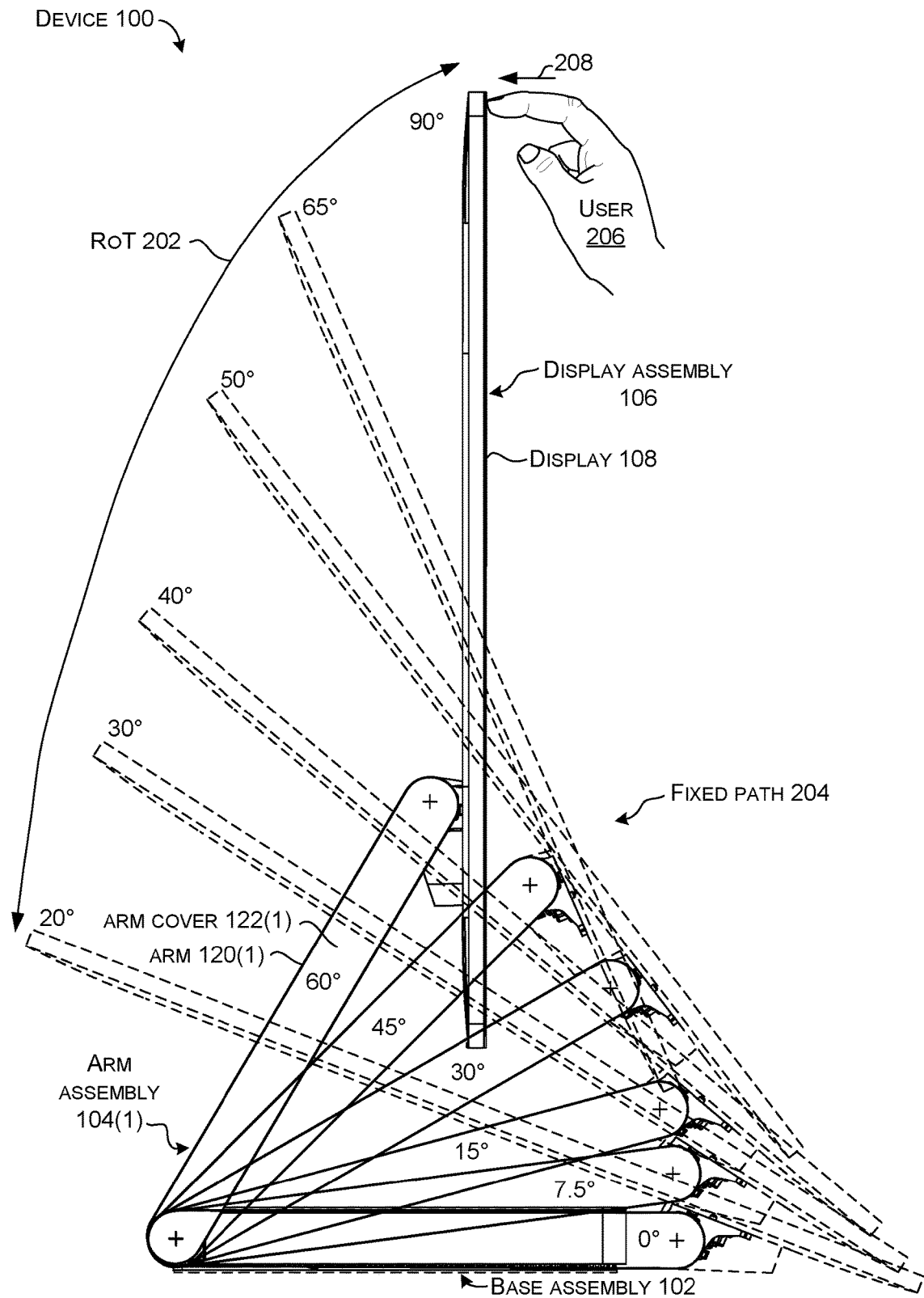

FIG. 2 shows the device 100 through a range of travel 202 along a fixed non-linear motion path 204 (e.g., with a single degree of freedom such that an individual angle of the hinge arm 120(1) translates to a specific individual angle of the display 108). Other implementations can provide two or more degrees of freedom (e.g., ability to select the arm angle independent of the display angle).

In the illustrated single degree of freedom example, a 60 degree alpha angle is translated into a 90 degree beta angle (e.g. work mode), a 45 degree alpha angle is translated into a 65 degree beta angle, a 30 degree alpha angle is translated into a 50 degree beta angle, a 15 degree alpha angle is translated into a 40 degree beta angle, a 7.5 degree alpha angle is translated into a 30 degree beta angle, and a zero degree alpha angle is translated into a 20 degree beta angle (e.g., draw mode), among others. Further, while the device can maintain an orientation during use, such as when a user 206 touches a touch sensitive version of the display, the user can almost effortlessly rotate the display 108 by supplying a small force 208 to the display assembly 106 or the arm assembly 104. From one perspective the device 100 can provide a nearly weightless experience to the adjusting user (e.g., the weight of the display assembly 106 can be effectively balanced (e.g., counter-balanced) throughout the range of travel 202).

However, in traditional solutions all of this motion can damage conductors routed between the base assembly and the display. For example, the conductors can be rubbed against other components causing fraying and ultimately shorting of the conductors. However, the present implementations can greatly reduce this damage. For instance, as the arm 120(1) moves through the range of travel 202 relative to the upper and lower axes of rotation 124(1) and 124(2), the conductors (118, FIG. 1B) can be subjected to much less motion (e.g., lesser extent of rotation and translation) and thereby much less wear and chance of becoming a point of failure.

Figure 3A:
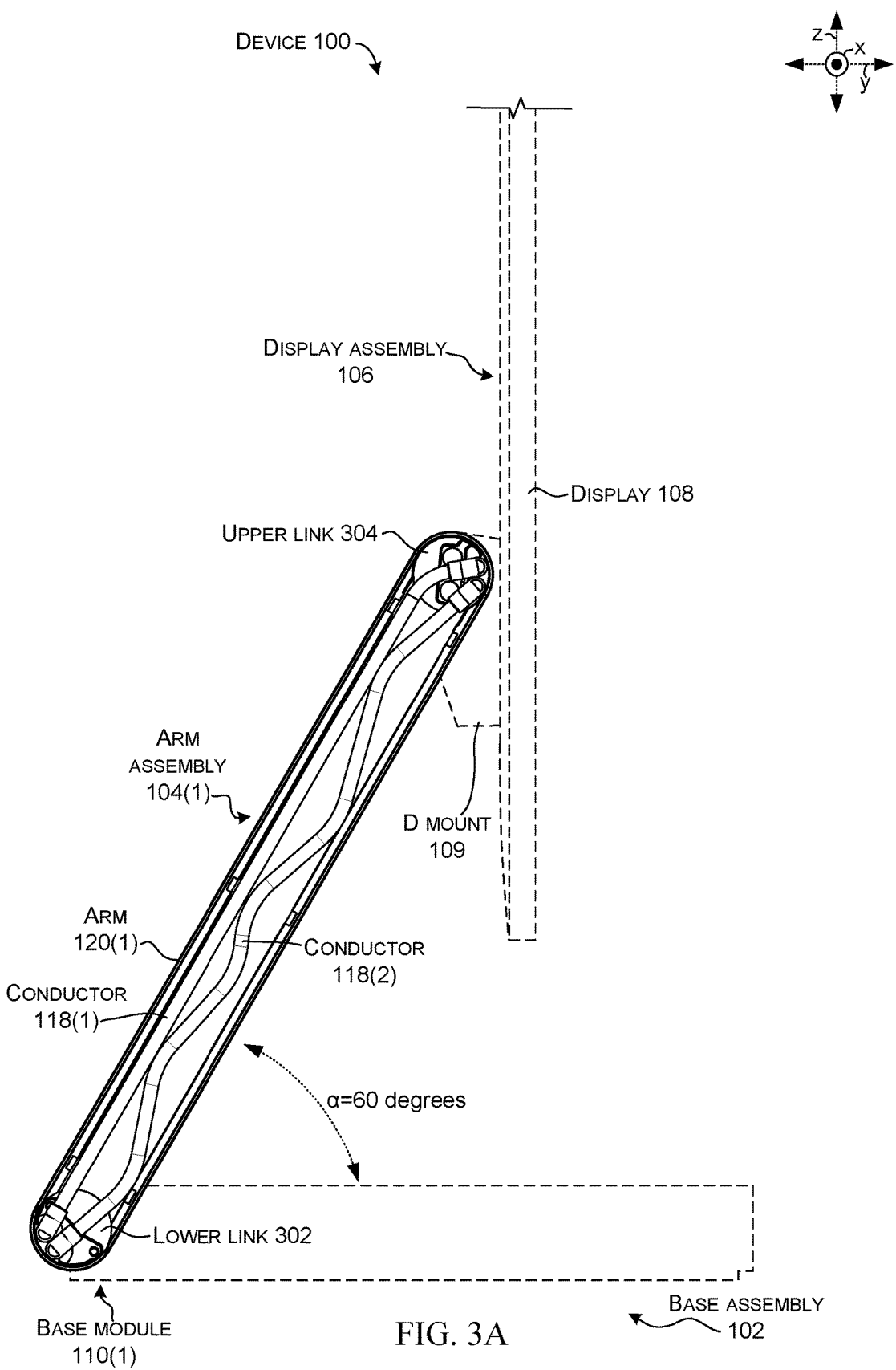
Figure 3B:
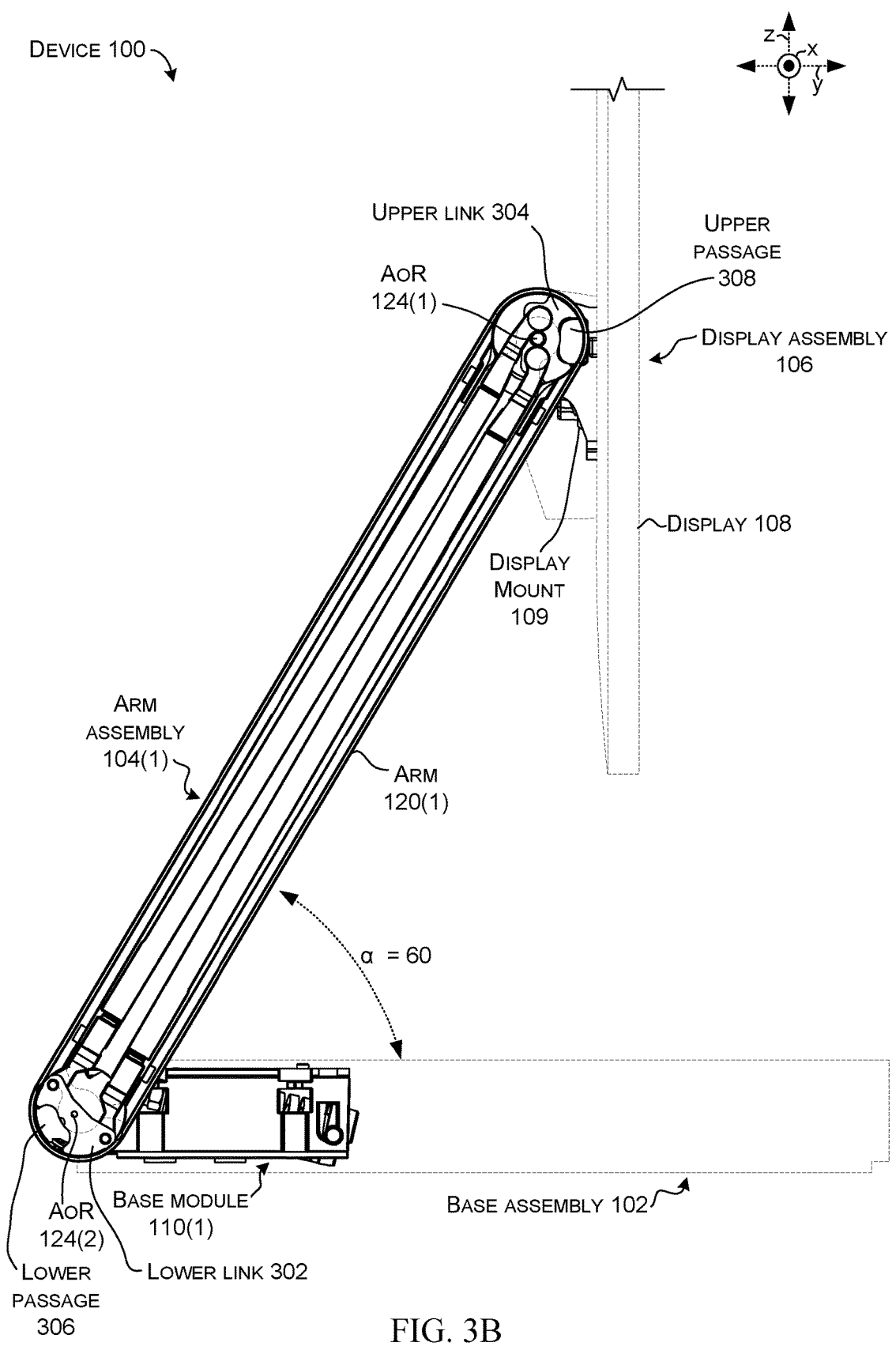
Figure 3C:
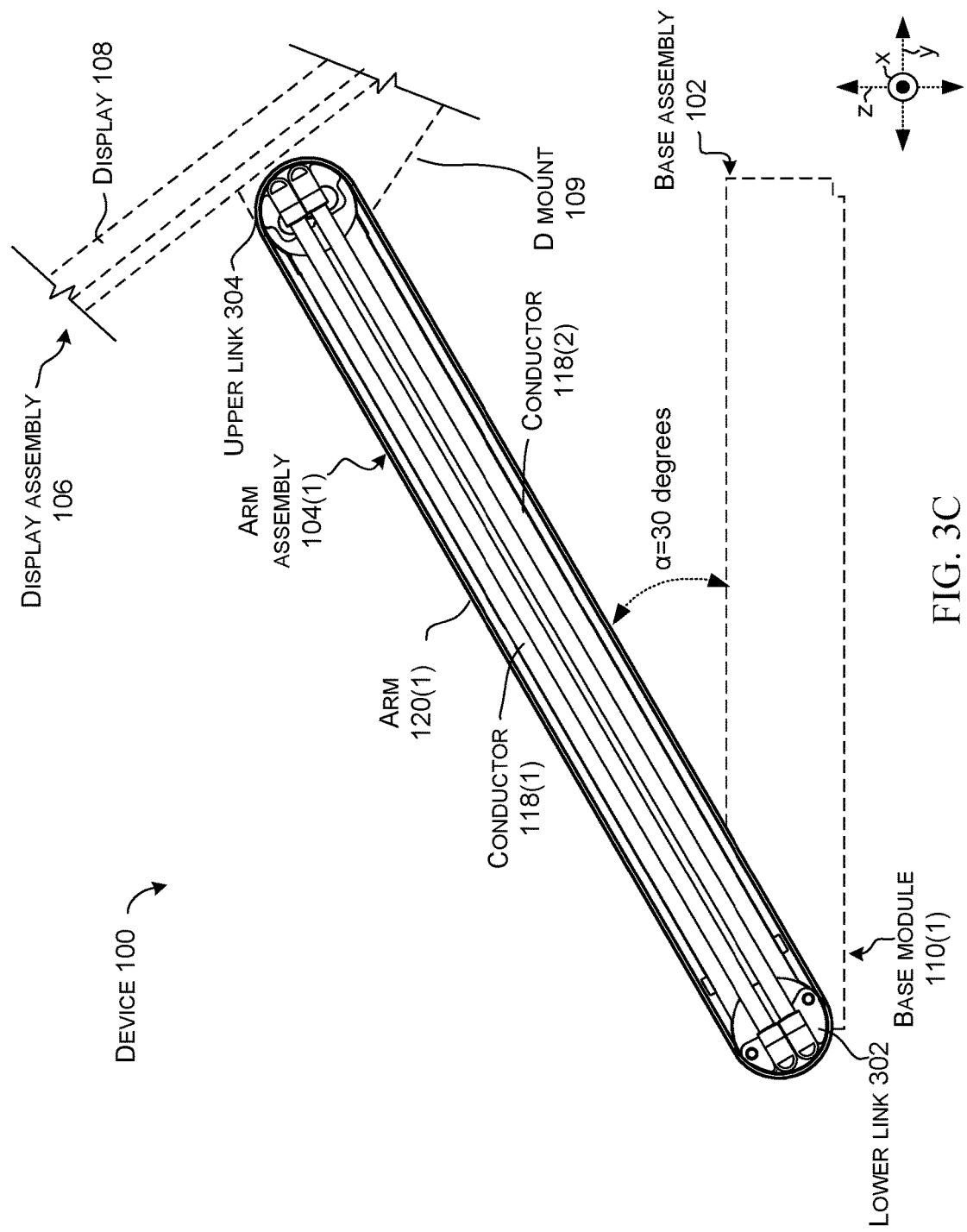
Figure 3D:
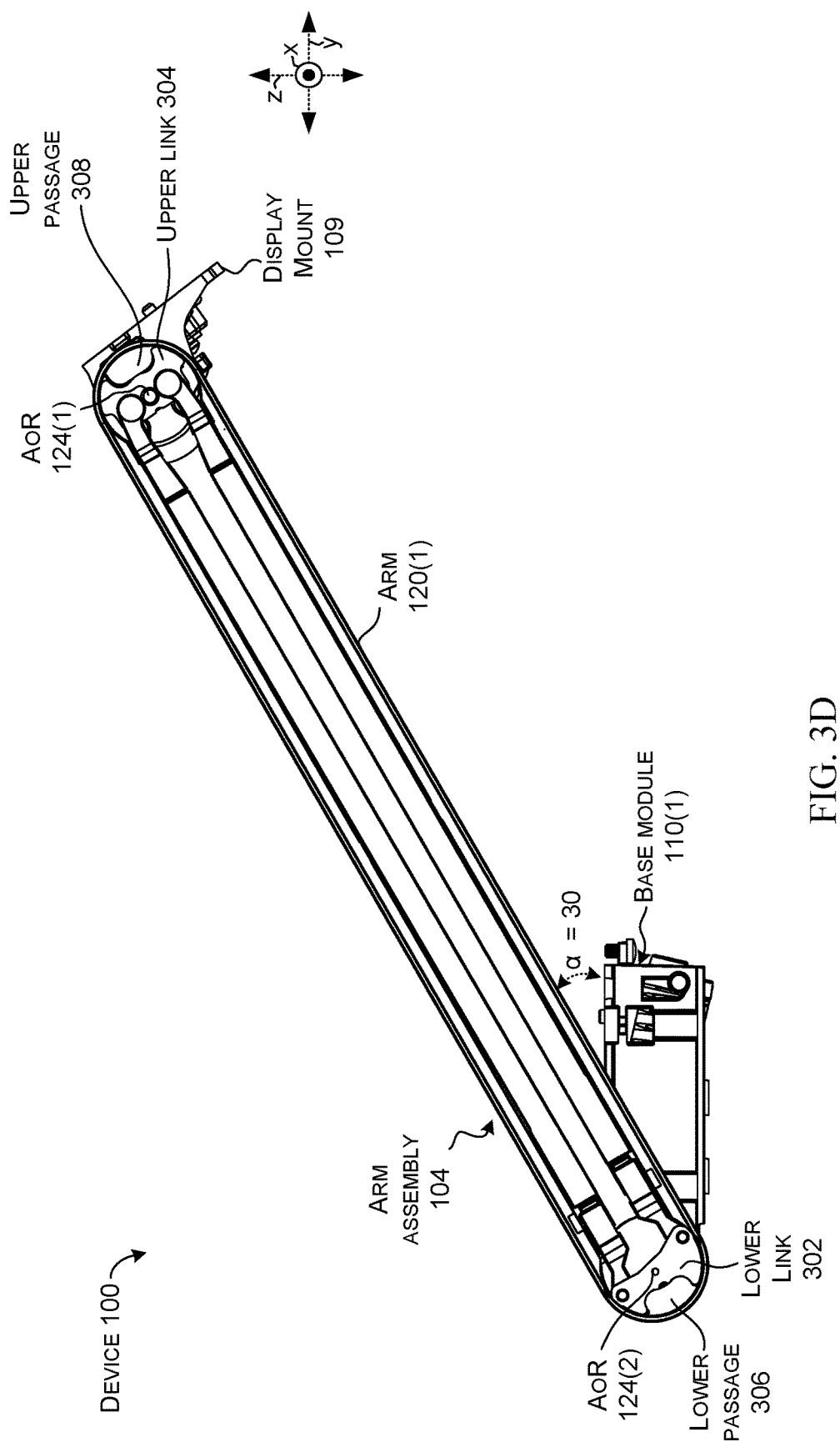

FIGS. 3A-3F collectively illustrate how the conductors 118 can be fixed to the base assembly 102 and the display assembly 106 to reduce relative motion (e.g., extent of rotation and translation) compared to the arm 120. FIGS. 3A and 3B show a 60 degree alpha angle. FIG. 3A includes the conductors 118. FIG. 3B is a similar view with the conductors removed. FIGS. 3C and 3D show a 30 degree alpha angle. FIG. 3C includes the conductors. FIG. 3D is a similar view with the conductors removed. FIGS. 3E and 3F show a zero degree alpha angle. FIG. 3E includes the conductors. FIG. 3F is a similar view with the conductors removed.

In the illustrated implementation, a structural member (e.g., 'lower structure') in the form of a lower link 302 is associated with arm 120(1). Similarly, another structural member (e.g., 'upper structure') in the form of an upper link 304 is associated with the arm 120(1). The lower link 302 can be fixedly secured to the base module 110. The upper link 304 can be fixedly secured to the display mount 109.

The lower link 302 can define a lower conductor passage (e.g., 'lower passage') 306 for the conductors 118. Similarly, the upper link 304 can define an upper conductor passage (e.g., 'upper passage') 308 for the conductors.

Figure 1D:
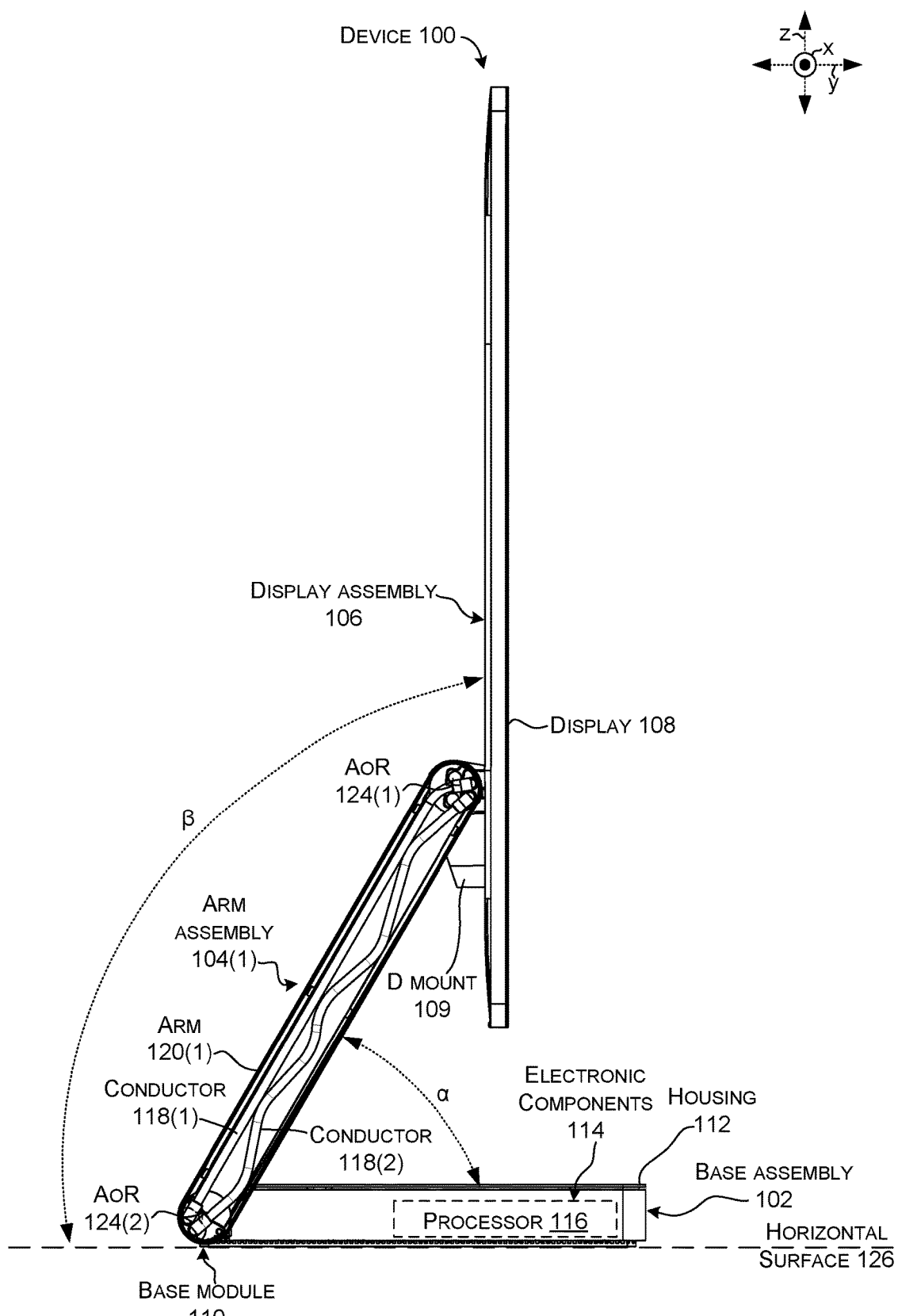

When the arm 120(1) rotates with the lower axis of rotation (124(2), FIG. 1D), the conductors 118 and the lower link 302 can remain stationary. Similarly, when the arm rotates with the upper axis of rotation (124(1), FIG. 1D) the conductors 118 and the upper link 304 remain stationary (e.g., maintain the same orientation) relative to the display mount 109. Thus, the only movement or rotation of the conductors can be relative to the arm 120(1).

Further, FIGS. 3C and 3D show the arm 120(1) at a mid-point of its range of travel (e.g., where the alpha angle is 30 degrees). At this mid-point, the conductors 118(1) and 118(2) experience equal paths relative to the arm assembly 104(1) (e.g., the path of conductor 118(1) can be the same length as the path of conductor 118(2)). The upper and lower passages 308 and 306 can be positioned so that they are opposing one another (e.g., as far apart as possible) at this mid-point in the rotation.

A length of the conductors 118 in the arm 120(1) can be determined at this mid-point orientation. When the arm is rotated to increase the alpha angle to 60 degrees (FIG. 3A), the distance between lower passage 306 and upper passage 308 experienced by conductor 118(2) decreases (evidenced by slack or sinusoidal shape of conductor 118(2)). Conversely, when the alpha angle is reduced to zero in FIG. 3E, conductor 118(2) experiences a longer path and tightens and conductor 118(1) experiences a shorter path as evidenced by slack in conductor 118(1). Further, because lower passage 306 and upper passage 308 center the conductors at the mid-point of rotation, the conductors are exposed to fewer degrees of rotation (e.g., lesser extent of rotation) and thereby less potential damage, such as twisting and/or abrasion. For instance, in this implementation, range of travel of the arm 120(1) at the alpha angle is 60 degrees, but the conductors 118 are only subjected to 30 degrees of rotation on either side of the mid-point (e.g., FIG. 3B).

FIGS. 4A-4C and 5A-5B collectively show the device 100 without the base assembly's housing 112 and without the display 108 (contrast with FIG. 1D). Looking at FIG. 4A, the display assembly 106 can include a display shaft 400 that can define upper axis of rotation 124(1), and display mount 109 can rotate around the display shaft. The display can be secured to the display mount.

In some implementations, arm 120(1) can be hollow (e.g., hollow portion 401) and can have an open side 402 that can be configured to receive arm cover 122. The arm can include upper and lower hubs 406 and 408 extending beyond a central region 410. The upper hub 406 can be secured to the display shaft 400 and the lower hub 408 can be secured to a base shaft 412 that can define the lower axis of rotation 124(2) of the base module 110. The arm 120(1) can allow mechanisms 414 to be positioned in the arm. The mechanism 414 can function in combination with arm 120(1), lower link 302, and/or upper link 304, to translate rotation between the base shaft 412 and the display shaft 400. In this case, the mechanism 414 can be implemented as outer and inner links 416(1) and 416(2).

The arm 120(1) can allow conductors (118, FIG. 1D) to run from the base assembly (102, FIG. 1D) to the display (108, FIG. 1D) through the arm without being visible to the user. Thus, the arm can protect the conductors from damage and create a visually appealing device.

Figure 4A:
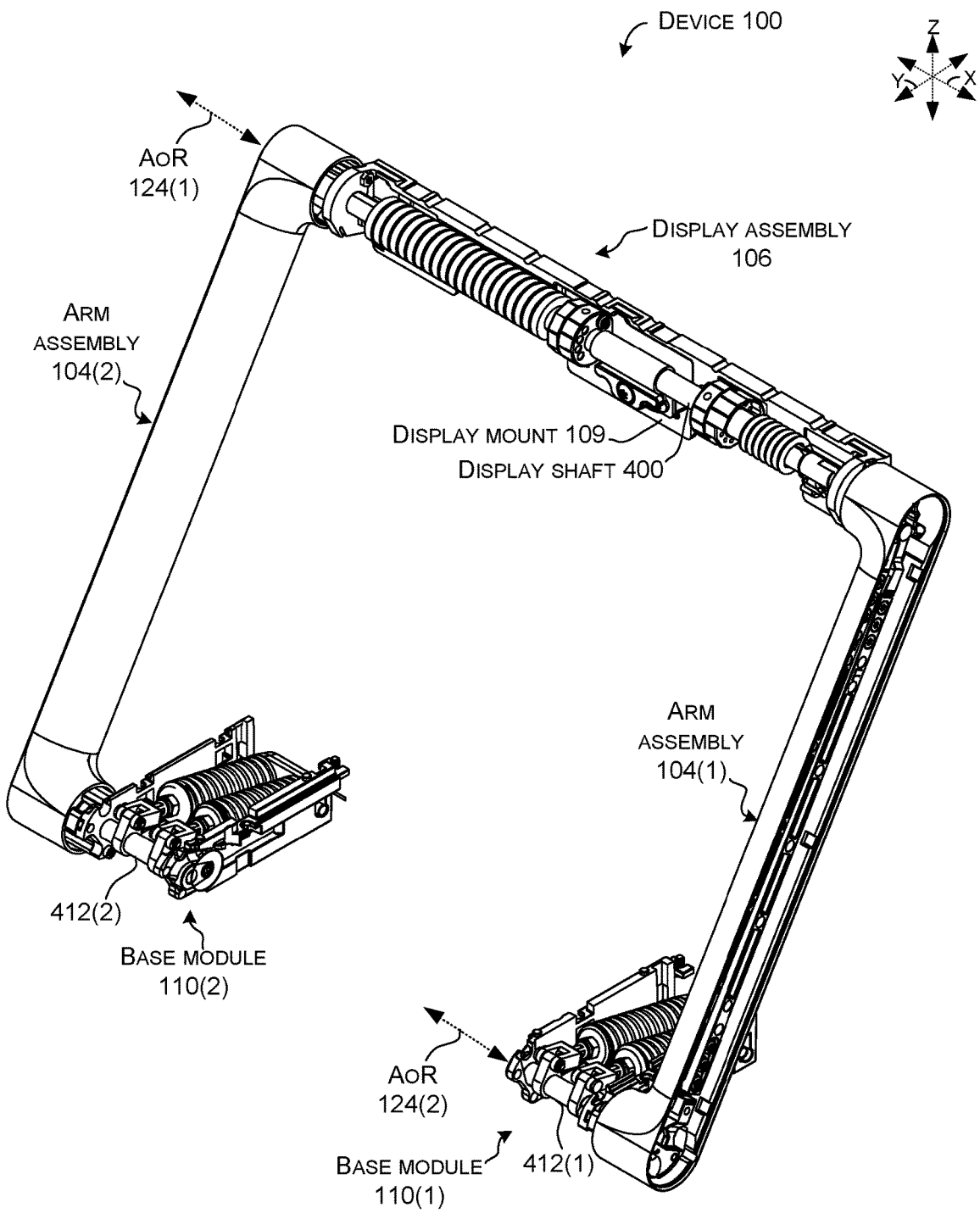
FIGS. 4A-4C are perspective views of portions of example devices in accordance with the present concepts.
Figure 4B:
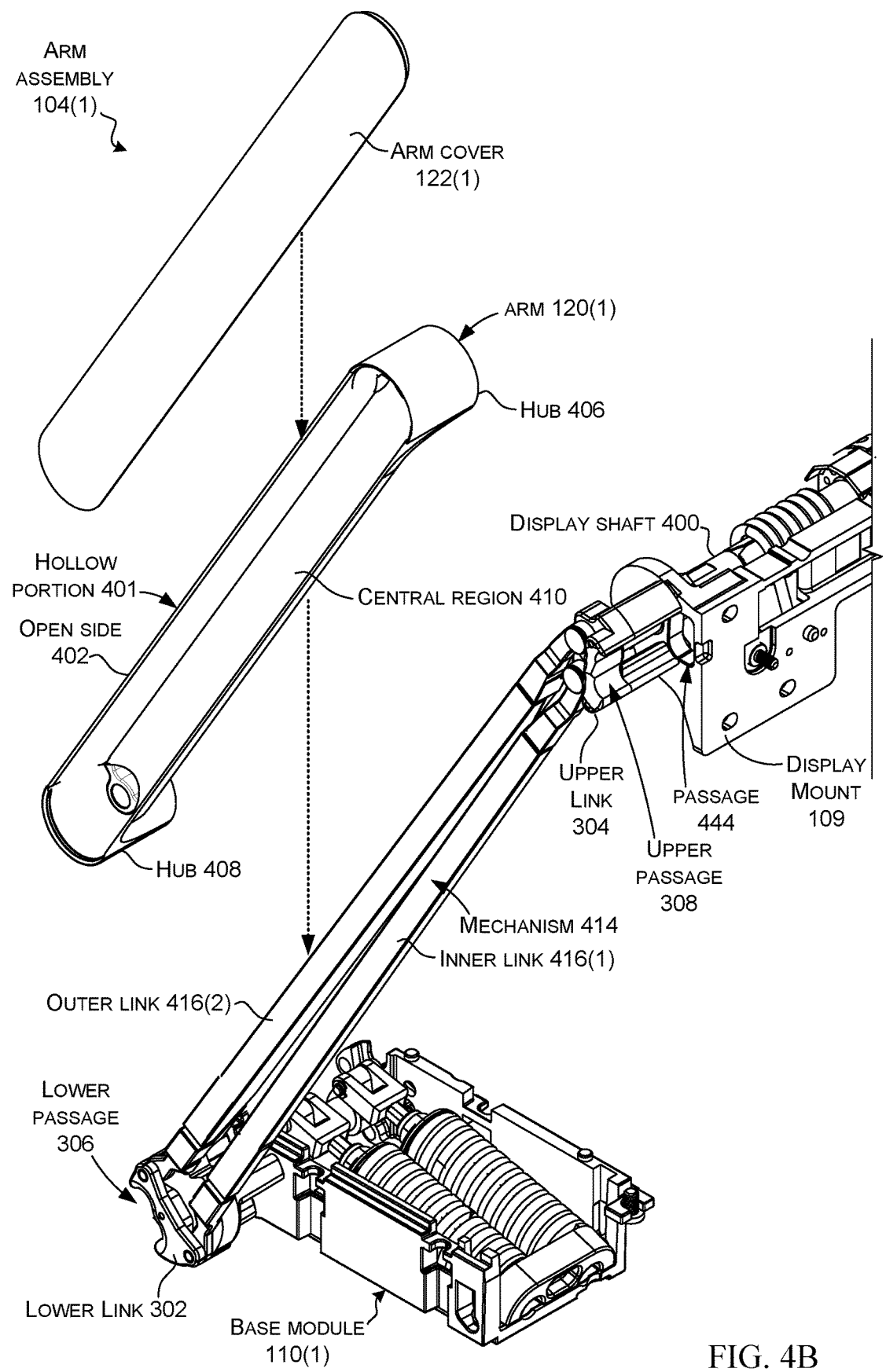
Figure 4C:
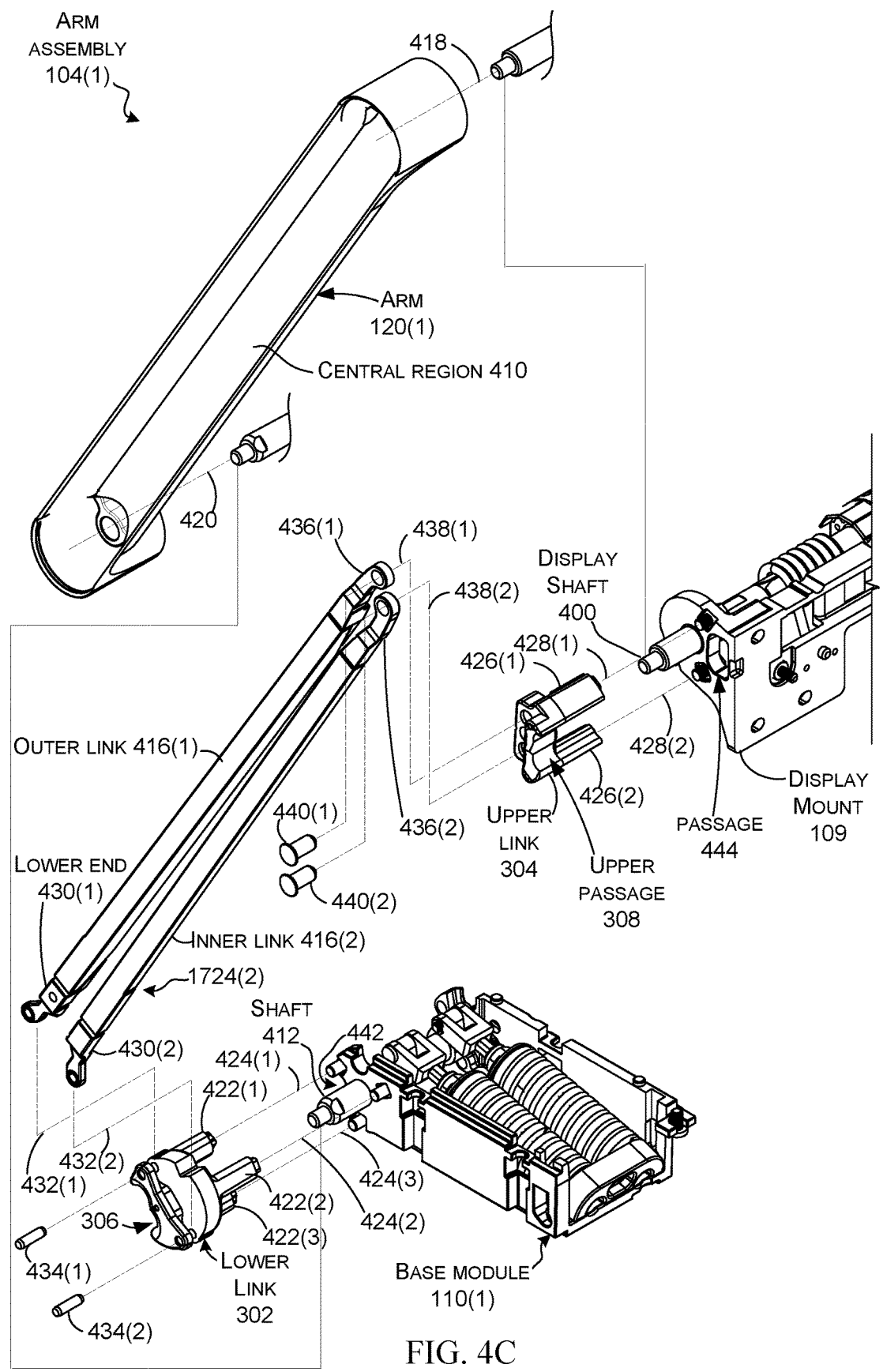

FIG. 4B is a perspective view of the arm assembly 104(1) with the arm 120(1) separated from the upper and lower links 302 and 304 and the outer and inner links 416(1) and 416(2), as well as arm cover 122(1) to visualize underlying components. FIG. 4C is a similar exploded view. FIG. 4C shows arm 120(1) can be secured to display shaft 400 as indicated by line 418 and base shaft 412 as indicated by line 420. To help visualize this, a portion of the display shaft and the base shaft are added in-line with the arm 120(1). In this example, inside arm 120(1), lower link 302 can be secured to the base module 110(1) via three legs 422(1)-422(3) as indicated by lines 424(1), 424(2), and 424(3) of FIG. 4C.

In this example, the upper link 304 can be secured to the display mount 109 of the display assembly 106 via two legs 426(1) and 426(2) as indicated by lines 428(1) and 428(2) of FIG. 4C. Lower ends 430(1) and 430(2) of the outer and inner links 416(1) and 416(2) can be secured to the lower link 302 as indicated by lines 432(1) and 432(2) with fasteners 434(1) and 434(2) (which define axis points between the outer and inner links and the lower link). Upper ends 436(1) and 436(2) of the outer and inner links can be secured to the upper link 304 as indicated by lines 438(1) and 438(2) with fasteners 440(1) and 440(2) (which define axis points between the inner and outer links and the upper link).

Note also that lower passage 306 can be aligned with a corresponding passage 442 through the base module 110(1). (Passage 442 is partially obscured in this view by shaft 412. Similarly, upper passage 308 can be aligned with a corresponding passage 444 through the display mount 109. As will be discussed in more detail below relative to FIGS. 6A and 6B, this combination of passages 442 and 306 can allow the conductors (118, FIG. 1D) to travel parallel to and along the base shaft, turn perpendicular to the base shaft to travel up the arm 120(1) and then turn parallel to and along the display shaft 400 through passages 308 and 444 to the display (108, FIG. 1D).

FIG. 5A shows a side view of arm assembly 104(1). FIG. 5B shows views of the arm 120(1), lower and upper links 302 and 304, and outer and inner links 416(1) and 416(2). The arm 120(1) can include upper hub 406, lower hub 408, and central region 410. The lower link's legs 422 can protrude between spokes 502 of lower hub 408 to reach the base module 110(1). Further, the legs 422 can define a range of rotation 504 for the hub (e.g., the legs act as stops for the hub and hence define the, for example, zero degree to 60 degree alpha angle range of rotation described above between the arm 120(1) and the base assembly 102 relative to FIG. 3). Of course, other implementations can have different ranges of rotations from the illustrated configuration. Gaps between legs 422 (such as legs 422(1) and 422(3)) can also define lower passage 306.

Similarly, the upper link's legs 428 can protrude through the upper hub 406 (e.g., between spokes 508) to reach the display mount 109. Further, the legs 428 can define a range of rotation 510 for the upper hub 406 (e.g., the legs act as stops for the hub and hence define the, for example, 20 degree to 90 degree display angle (e.g., beta angle) range of rotation described above relative to FIG. 2. (Of course, other implementations can have different ranges of rotations from the illustrated configuration).

Figure 6A:
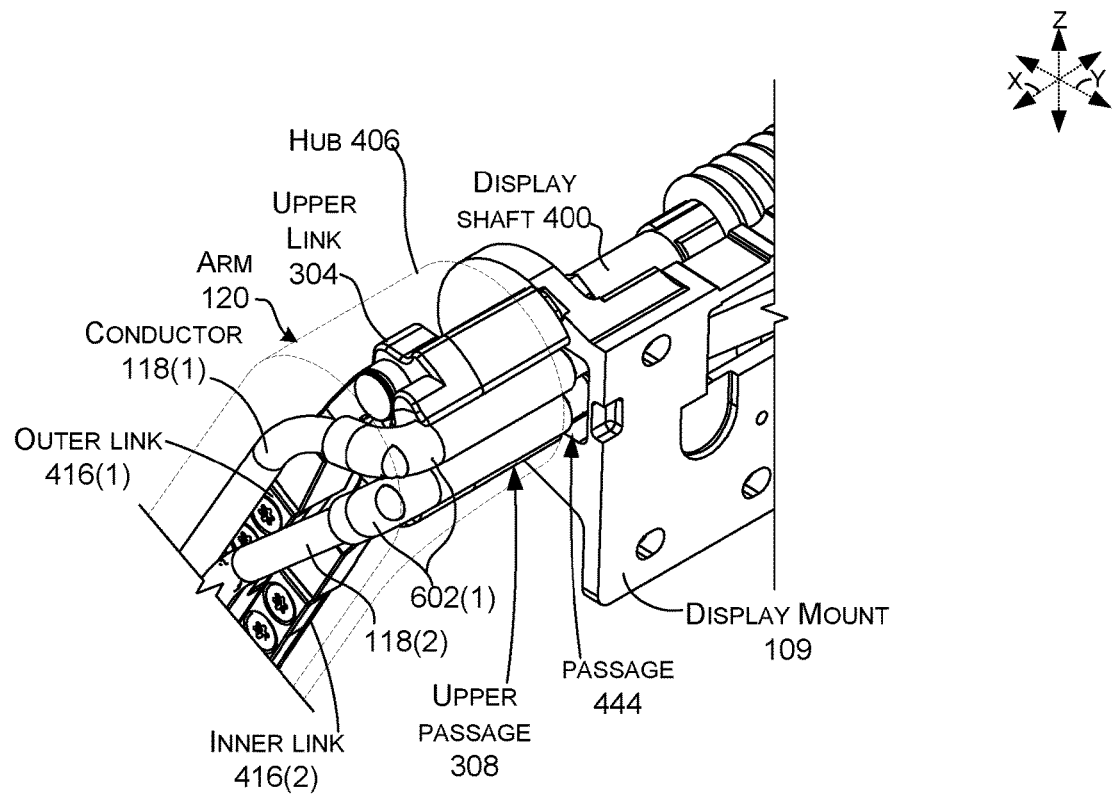
FIGS. 6A and 6B are perspective views of portions of example devices in accordance with the present concepts.
Figure 6B:
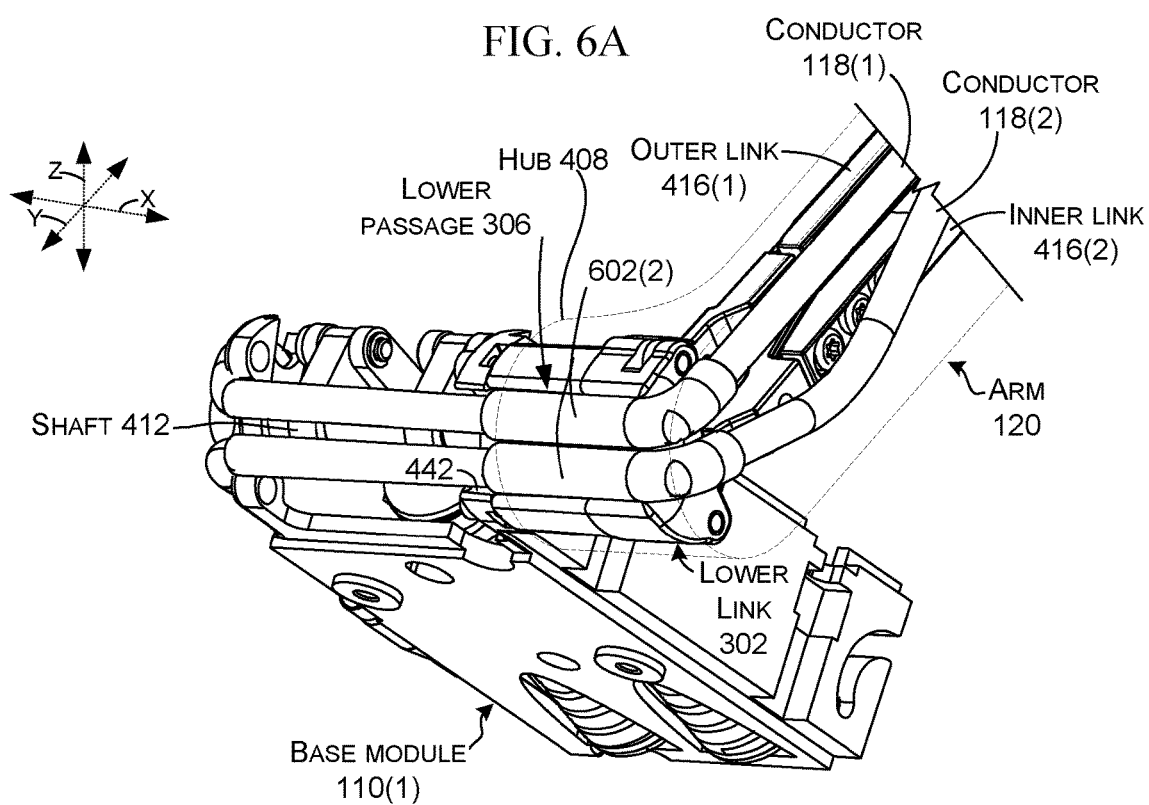

FIGS. 6A and 6B collectively show views of the conductors 118 at arm assembly 104 to display assembly 106 interface and arm assembly to base assembly 102 interface respectively. The arm 120(1) is shown in ghost to allow underlying components to be more readily visualized.

As illustrated in FIG. 6A, in this implementation starting at the display mount 109, passage 444 and upper passage 308 can allow the conductors 118 to travel parallel to the display shaft 400 from the display mount 109 and through hub 406 into the upper link 304. At the upper link 304, the conductors can be transitioned approximately 90 degrees and travel parallel to the outer link 416(1) and inner link 416(2) in the arm 120(1). Reinforcing elbows 602(1) can be employed to facilitate transitioning the conductors 118 from parallel to the display shaft 400 to parallel to the arm 120(1). The reinforcing elbows can further protect the conductors 118 from abrasion as the arm rotates with the display shaft 400.

As illustrated in FIG. 6B, in this implementation, starting at the base assembly's base module 110(1), the conductors 118 can be guided parallel to base shaft 412 along the base module's passage 442 and through the arm's lower hub 408 into lower link 302. At the lower link 302 the conductors 118 can be guided through lower passage 306 and the conductors can be transitioned approximately 90 degrees and travel parallel to the outer link 416(1) and inner link 416(2) in the arm 120(1). Reinforcing elbows 602(2) can be employed to facilitate transitioning the conductors 118 from parallel to the base shaft 412 to parallel to the arm 120(1). The reinforcing elbows 602(2) can further protect the conductors 118 from abrasion as the arm rotates with the base shaft 412.

To summarize, in this implementation passage 442 in the base module 110(1) can be aligned with lower passage 306 in the lower link 302 to allow the conductors 118 to travel into the arm 120(1) parallel to the lower axis of rotation (124(2), FIG. 1D) and represented here by base shaft 412. Passage 306 can allow the conductors 118 to travel through the lower hub 408 rather than around the hub. The lower link can further facilitate transitioning the conductors 118 to travel up the arm 120(1). The conductors 118 can then enter upper passage 308 of the upper link 304 where the conductors can be transitioned to travel parallel to the display shaft 400 (e.g., parallel to the upper axis of rotation (124(1), FIG. 1)) through upper passage 308, through hub 406, and through passage 444 into the display mount 109. This configuration can allow the conductors to pass through the hub 406 parallel to the display shaft rather than being routed around the hub or through the hub radial to the display shaft. Thus, the conductors can be fixed to the base module 110(1) and the display mount 109 rather than being fixed to the arm and move relative to the base module and display mount. Fixing the conductors relative to the base module and the display mount and passing the conductors through the arm's hubs parallel to the shafts can greatly reduce the range of motion experienced by the conductors. The resulting device that incorporates the present concepts can be more aesthetically appealing than previous solutions because the conductors are generally covered from the base assembly 102 to the display assembly 106. Further, the device employing the present concepts can be more reliable because the conductors are exposed to less motion and as a result are less likely to fail during the lifetime of the device.

The above identified components can be made from various structural materials, such as metals, polymers, and/or composites. The components can be formed utilizing various techniques, such as 3D printing, machining, metal injection molding, etc. The conductors can be configured as elongate electrically conductive materials and tend to be covered with an electrically insulative material.

Various device examples are described above. Additional examples are described below. One example includes a device comprising a base assembly that includes a processor and that is configured to define a lower axis of rotation. The example also includes a display assembly including a display that is configured to rotate around an upper axis of rotation and that is controlled by the processor. The example also includes an arm assembly extending from the base assembly at the lower axis of rotation to the display assembly at the upper axis of rotation. The arm assembly comprises a hollow arm extending from a lower hub on the lower axis of rotation to an upper hub on the upper axis of rotation. The device further comprises a lower link fastened to the base assembly through the lower hub and defining a lower conductor passage, an upper link fastened to the display assembly through the upper hub and defining an upper conductor passage, and a conductor extending from the processor along the lower axis of rotation through the lower conductor passage, up the arm, and through the upper passage along the upper axis of rotation to the display.

Another example can include any of the above and/or below examples where the conductor includes a reinforcing elbow positioned in the lower conductor passage and the reinforcing elbow is configured to flex the conductor from parallel to the lower axis to perpendicular to the lower axis.

Another example can include any of the above and/or below examples where the conductor includes an upper reinforcing elbow positioned in the upper conductor passage and the device is configured to flex the conductor from perpendicular to the upper axis to parallel to the upper axis of rotation.

Another example can include any of the above and/or below examples where the conductor comprises first and second conductors.

Another example can include any of the above and/or below examples where the upper link is secured to a display mount of the display assembly, and where the arm assembly is configured to translate rotation of the arm assembly relative to the base assembly to a position of the display mount.

Another example can include any of the above and/or below examples where the rotation includes a range of rotation from zero degrees to sixty degrees and where the arm assembly rotates the upper link so that at zero degrees the first conductor experiences a longer path than the second conductor in the arm assembly, at thirty degrees the first and second conductors experience equal paths in the arm assembly, and at sixty degrees the second conductor experiences a longer path than the first conductor in the arm assembly.

Another example can include any of the above and/or below examples where the rotation includes a range of rotation from zero degrees to ninety degrees and where the arm assembly rotates the upper link so that at zero degrees the first conductor experiences a longer path than the second conductor in the arm assembly, at forty five degrees the first and second conductors experience equal paths in the arm assembly, and at ninety degrees the second conductor experiences a longer path than the first conductor in the arm assembly.

Another example can include any of the above and/or below examples where the rotation includes a range of rotation and in a first half of the range of rotation the first conductor experiences a longer path than the second conductor in the arm assembly, and in a second half of the range of rotation the second conductor experiences a longer path than the first conductor in the arm assembly.

Another example can include any of the above and/or below examples where the first and second conductors pass from the arm through the upper conductor passage and is secured to the display mount and connected to the display.

Another example can include any of the above and/or below examples where an extent of rotation experienced by the first and second conductors at the upper conductor passage is determined by rotation of the upper link relative to the upper hub.

Another example can include any of the above and/or below examples where an extent of rotation experienced by the first and second conductors at the lower conductor passage is determined by rotation of the lower link relative to the lower hub.

Another example can include any of the above and/or below examples where the lower conductor passage is parallel to the lower axis of rotation and the upper conductor passage is parallel to the upper axis of rotation.

Another example can include a device comprising a base assembly that includes an electronic component and that is configured to define a lower axis of rotation; a display assembly including a display that is configured to rotate around an upper axis of rotation; and an arm assembly extending from the base assembly at the lower axis of rotation to the display assembly at the upper axis of rotation. The arm assembly comprises a hollow arm extending from a lower hub on the lower axis of rotation to an upper hub on the upper axis of rotation. The device further comprises a lower link and an upper link. The lower link can be fastened to the base assembly through the lower hub and define a lower conductor passage. The upper link can be fastened to the display assembly through the upper hub and define an upper conductor passage. A conductor can extend from the electronic component along the lower axis of rotation through the lower conductor passage, up the arm, and through the upper conductor passage along the upper axis of rotation to the display. An extent of rotation experienced by the conductor is defined by rotation of the lower hub relative to the lower link and the upper hub relative to the upper link.

Another example can include any of the above and/or below examples where the electronic component comprises a processor, a battery, or an AC to DC converter.

Another example can include any of the above and/or below examples where the lower hub includes one or more spokes that extend radially relative to the lower axis of rotation and where the lower passage extends between the spokes.

Another example can include any of the above and/or below examples where the upper hub includes one or more spokes that extend radially relative to the upper axis of rotation and where the upper passage extends between the spokes.

Another example can include a device comprising a base assembly including a base shaft and an upper assembly including an upper shaft. An arm can be secured to the base shaft and the upper shaft to translate a range of rotation of the arm around the base shaft to rotation around the upper shaft. A conductor can extend from the base assembly into the arm parallel to the base shaft and can extend from the arm into the upper assembly parallel to the upper shaft.

Another example can include any of the above and/or below examples where the device further comprises a lower structure positioned in the arm and fastened to the base assembly through the arm. An upper structure can be positioned in the arm and fastened to the upper assembly through the arm.

Another example can include any of the above and/or below examples where the arm rotates through a range of rotation that includes rotation relative to the base shaft and the upper shaft.

Another example can include any of the above and/or below examples where the conductor comprises first and second conductors. In a first half of the range of rotation the first conductor experiences a longer path than the second conductor in the arm, and in a second half of the range of rotation the second conductor experiences a longer path than the first conductor in the arm.

CONCLUSION

Although techniques, methods, devices, systems, etc., pertaining to device wiring are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising: a base assembly that includes a processor and that is configured to define a lower axis of rotation; a display assembly including a display that is controlled by the processor and that is configured to rotate around an upper axis of rotation; an arm assembly extending from the base assembly at the lower axis of rotation to the display assembly at the upper axis of rotation, the arm assembly comprising a hollow arm extending from a lower hub on the lower axis of rotation to an upper hub on the upper axis of rotation; a lower link fastened to the base assembly through the lower hub and defining a lower conductor passage; an upper link fastened to the display assembly through the upper hub and defining an upper conductor passage; and, a conductor extending from the processor, entering the lower conductor passage along the lower axis of rotation from the base assembly; then extending up the hollow arm, out of the upper conductor passage along the upper axis of rotation, and to the display, the conductor including a reinforcing elbow positioned in the lower conductor passage and wherein the reinforcing elbow transitions the conductor from parallel to the lower axis to perpendicular to the lower axis.

2. The device of claim 1, wherein the conductor includes an upper reinforcing elbow positioned in the upper conductor passage and wherein the upper reinforcing elbow transitions the conductor from perpendicular to the upper axis to parallel to the upper axis of rotation.

3. The device of claim 2, wherein the conductor comprises first and second conductors.

4. The device of claim 3, wherein the upper link is secured to a display mount of the display assembly, and wherein the arm assembly translates rotation of the arm assembly relative to the base assembly to a position of the display mount.

5. The device of claim 4, wherein the rotation includes a range of rotation from zero degrees to sixty degrees and wherein the arm assembly rotates the upper link so that at zero degrees the first conductor experiences a longer path than the second conductor in the arm assembly, at thirty degrees the first and second conductors experience equal paths in the arm assembly, and at sixty degrees the second conductor experiences a longer path than the first conductor in the arm assembly.

6. The device of claim 4, wherein the rotation includes a range of rotation from zero degrees to ninety degrees and wherein the arm assembly rotates the upper link so that at zero degrees the first conductor experiences a longer path than the second conductor in the arm assembly, at forty five degrees the first and second conductors experience equal paths in the arm assembly, and at ninety degrees the second conductor experiences a longer path than the first conductor in the arm assembly.

7. The device of claim 4, wherein the rotation includes a range of rotation and in a first half of the range of rotation the first conductor experiences a longer path than the second conductor in the arm assembly, and in a second half of the range of rotation the second conductor experiences a longer path than the first conductor in the arm assembly.

8. The device of claim 4, wherein the first and second conductors pass from the hollow arm through the upper conductor passage and are secured to the display mount and connected to the display.

9. The device of claim 8, wherein an extent of rotation experienced by the first and second conductors at the upper conductor passage is determined by rotation of the upper link relative to the upper hub.

10. The device of claim 8, wherein an extent of rotation experienced by the first and second conductors at the lower conductor passage is determined by rotation of the lower link relative to the lower hub.

11. The device of claim 2, wherein the lower conductor passage is parallel to the lower axis of rotation and the upper conductor passage is parallel to the upper axis of rotation.

12. A device, comprising: a base assembly that includes an electronic component and that is configured to define a lower axis of rotation; a display assembly including a display that is configured to rotate around an upper axis of rotation; an arm assembly extending from the base assembly at the lower axis of rotation to the display assembly at the upper axis of rotation; the arm assembly comprising a hollow arm extending from a lower hub on the lower axis of rotation to an upper hub on the upper axis of rotation; a lower link fastened to the base assembly through the lower hub and defining a lower conductor passage; an upper link fastened to the display assembly through the upper hub and defining an upper conductor passage; and, a conductor extending from the electronic component parallel to the lower axis of rotation through the base assembly and into the lower conductor passage, up the hollow arm, through the upper conductor passage along the upper axis of rotation, and to the display, wherein an extent of rotation experienced by the conductor is defined by rotation of the lower hub relative to the lower link and the upper hub relative to the upper link, the conductor including a reinforcing elbow positioned in the lower conductor passage and wherein the reinforcing elbow transitions the conductor from parallel to the lower axis to perpendicular to the lower axis.

13. The device of claim 12, wherein the electronic component comprises a processor, a battery, or an AC to DC converter.

14. The device of claim 12, wherein the lower hub includes one or more spokes that extend radially relative to the lower axis of rotation and wherein the lower conductor passage extends between the spokes.

15. The device of claim 12, wherein the upper hub includes one or more spokes that extend radially relative to the upper axis of rotation and wherein the upper conductor passage extends between the spokes.

16. A device, comprising: a base assembly including a base shaft and an electronic component; an upper assembly including an upper shaft; an arm secured to the base shaft and the upper shaft that translates a range of rotation of the arm around the base shaft to rotation around the upper shaft; a lower structure positioned in the arm and fastened to the base assembly; and, a conductor that extends from the electronic component through the base assembly parallel to the base shaft into the arm and extends from the arm into the upper assembly parallel to the upper shaft, such that the conductor is concealed inside the base assembly, the arm, and the upper assembly, the conductor including a reinforcing elbow positioned in the lower structure and wherein the reinforcing elbow transitions the conductor from parallel to the base shaft to perpendicular to the base shaft.

17. The device of claim 16, further comprising an upper structure positioned in the arm and fastened to the upper assembly.

18. The device of claim 17, wherein the lower structure and the upper structure limit a range of rotation of the arm relative to the base shaft and the upper shaft.

19. The device of claim 18, wherein the conductor comprises first and second conductors and in a first half of the range of rotation the first conductor experiences a longer path than the second conductor in the arm, and in a second half of the range of rotation the second conductor experiences a longer path than the first conductor in the arm.

* * * * *